(12) United States Patent  
Callaghan et al.

(10) Patent No.: US 6,315,833 B1
(45) Date of Patent: Nov. 13, 2001

(54) SILICON CARBIDE SLEEVE FOR SUBSTRATE SUPPORT ASSEMBLY

(75) Inventors: Lori A. Callaghan, Los Gatos; Roger N. Anderson, Sunnyvale; David K. Carlson, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/346,657

(22) Filed: Jul. 1, 1999

(51) Int. Cl.[7] .................................................. C23C 16/00
(52) U.S. Cl. ........................ 118/729; 118/728; 118/730; 118/500; 29/428; 29/525.01; 156/345
(58) Field of Search .................................. 118/728, 729, 118/730, 500; 29/525.01, 428; 156/345

(56) References Cited

U.S. PATENT DOCUMENTS

| | | | |
|---|---|---|---|
| 4,817,558 | * 4/1989 | Itoh | 118/715 |
| 4,990,374 | * 2/1991 | Keeley | 118/715 |
| 5,273,588 | * 12/1993 | Foster | 118/715 |
| 5,525,159 | * 6/1996 | Hama | 118/715 |
| 5,851,299 | * 12/1998 | Cheng | 118/728 |
| 5,972,116 | * 10/1999 | Takagi | 118/729 |
| 6,053,982 | * 4/2000 | Halpin | 118/728 |

* cited by examiner

Primary Examiner—Richard Bueker
(74) Attorney, Agent, or Firm—Blakely Sokoloff Taylor & Zafman

(57) ABSTRACT

An apparatus for and method of supporting a substrate such as a semiconductor wafer. Silicon carbide sleeves cover substrate support members such as upwardly extending arms of a substrate carrier which is part of a substrate support assembly. The substrate carrier including the upwardly extending arms holds the substrate spaced apart from a platform such as a susceptor during loading and unloading of a processing chamber. The platform defines apertures through which the arms extend. The arms are vertically movable through the apertures with respect to the platform and engage the substrate at the substrate's edge or alternatively, inwardly from the edge.

20 Claims, 10 Drawing Sheets

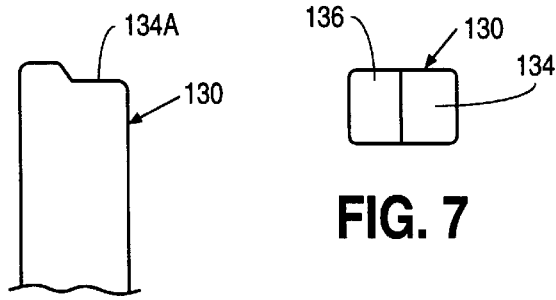
FIG. 7
FIG. 8A
FIG. 8B
FIG. 8C
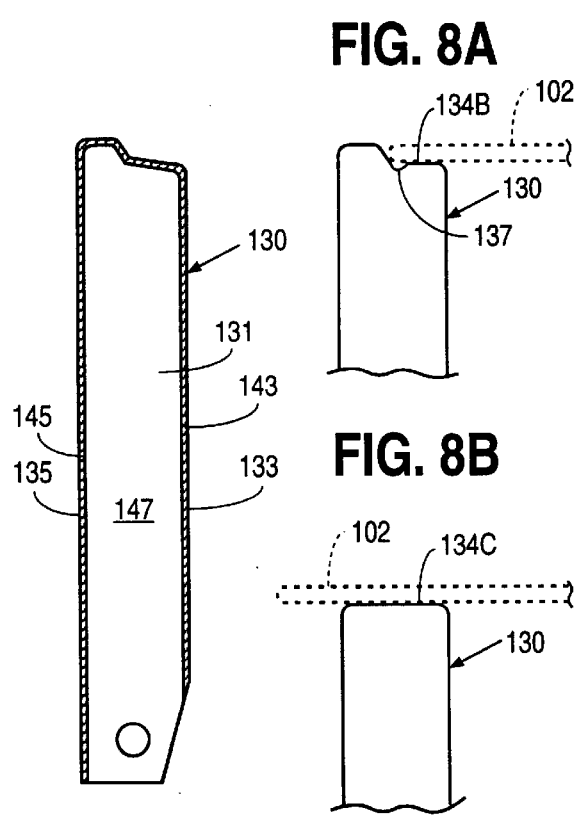
FIG. 9
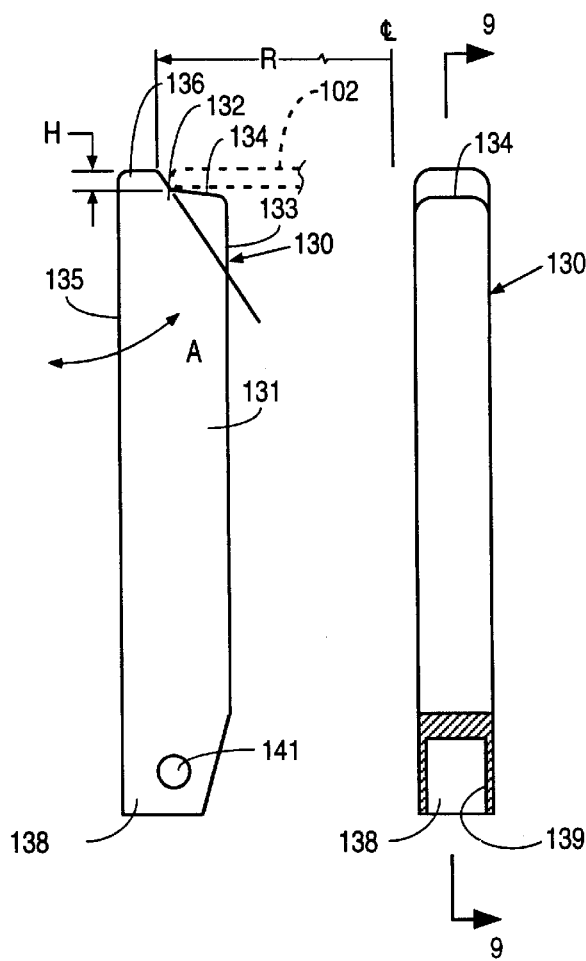
FIG. 5   FIG. 6

1

SILICON CARBIDE SLEEVE FOR SUBSTRATE SUPPORT ASSEMBLY

FIELD OF THE INVENTION

The present invention relates generally to the field of substrate processing for semiconductor manufacturing and, more specifically, to an improved apparatus for supporting or carrying a silicon substrate or wafer.

BACKGROUND OF THE INVENTION

An important step in integrated circuit manufacturing is the processing of the semiconductor substrate in which active devices such as transistors and capacitors that comprise the integrated circuits are formed. In the course of forming integrated circuit structures on semiconductor wafers, certain processes are utilized that may take place in enclosed chambers into which the wafer is carried and within which the wafer is held during processing. Some of these processes include, for example, growth of an epitaxial silicon layer, the formation of a thermal oxide or thermal nitride layer over silicon, the rapid thermal annealing of integrated circuit structures already formed on the wafer, etc. Generally, the wafer is held in a horizontal position during processing. Typically, a platform such as a susceptor, or a wafer carrier or lifting mechanism may be used for supporting the wafer horizontally.

One example of a processing chamber includes a platform on which the substrate (or more specifically, wafer) rests during processing. One type of platform commonly used in an epitaxial atmospheric chamber is known as a susceptor. The processing chamber can also include a substrate carrier which carries the substrate onto the platform or lifts the substrate from the platform. Together, the platform (susceptor, for example) and substrate carrier can be referred to as a substrate support assembly. The substrate carrier typically includes pins or arms that extend upwardly through apertures in the susceptor. When the substrate (or wafer) is inserted into the processing chamber, it is placed onto the tops of the upwardly extended pins or arms such that it is spaced apart from the surface of a pocket defined at the top of the susceptor. Then the pins or arms are either lowered such that the wafer is lowered to the surface of the susceptor pocket, or the body of the susceptor can be raised to the level of the wafer while the pins or arms remain stationary. The pins can contact the wafer at points inwardly from the wafer's edge, or the arms or pins can engage the wafer near its edge or periphery.

The pins or arms can be fabricated out of quartz, for example. The atmosphere within a processing chamber can be very harmful to materials such as quartz and can shorten the life span of parts made from such materials. During the creation of the silicon layers on the wafer, for example, corrosive gases in combination with high temperatures and extremely wide variations in temperature are used. One example of a potentially harmful gas is gaseous hydrochloric acid (HCl). Also, the quartz parts are periodically cleaned with aqueous hydrofluoric acid (HF), for example. These environmental factors can be destructive to quartz, especially when relatively small and intricate details are machined into the quartz pins or arms.

Replacement of worn quartz parts can be expensive and time consuming. For example, when a substrate carrier needs to be replaced, the processing chamber must be disassembled and is out of service for a period of time. Thus, it is desirable to provide parts that are durable in the harmful environment of semiconductor processing chambers.

Silicon carbide (SiC) has proven to be a more robust material than quartz in epitaxial atmospheric chambers, for example. The use of SiC on the tips of the quartz arms is desirable because SiC is more durable in the harmful atmosphere of the processing chamber than quartz.

Thus, what is needed is a novel apparatus that provides a durable yet geometrically and dimensionally precise support arm or pin for a substrate support or carrier.

SUMMARY OF THE INVENTION

The present invention relates to a substrate support assembly for supporting a substrate such as a semiconductor wafer in a processing chamber, for example. The invention provides a durable protective covering for upwardly extending arms of a substrate carrier. The covering is preferably removable such that it can be replaced.

An example of a substrate support assembly of the present invention comprises a platform defining a pocket for the substrate and defining a plurality of apertures. The platform of an epitaxial atmospheric chamber, for example, is known as a susceptor. The substrate carrier includes upwardly extending arms that extend through corresponding apertures in the platform. The tops of the arms can be configured to engage the periphery or edge of a wafer or, alternatively, can engage the bottom surface of the wafer at points inwardly from the wafer's periphery. The substrate (or wafer) is carried (or lifted) by the substrate carrier. For example, the wafer can be placed on the tops of the arms when the substrate carrier is in a raised position. The substrate carrier with the wafer can then be lowered such that the arms are lowered through the apertures of the platform. Once the tops of the arms moved past the top surface of the pocket, the wafer comes to rest in the pocket.

In one exemplary embodiment, the substrate carrier includes three upwardly extending arms that are aligned with and movable through corresponding apertures defined through the platform.

In one example of the invention, a sleeve is provided to cover at least a portion of a corresponding arm of the substrate carrier. Preferably, a plurality of sleeves is provided such that each arm has a corresponding sleeve. The sleeves are preferably removable, and are made of a durable material that can withstand the harsh environment of the processing chamber. An alternate example of the invention provides a coating on the quartz arms. The sleeve or coating can be SiC, for example.

BRIEF DESCRIPTION OF THE DRAWINGS

The present invention is illustrated by way of example, and not limitation, in the figures of the accompanying drawings in which:

FIG. 5 is a side elevational view of a sleeve in accordance with the present invention;

FIG. 6 is a front elevational view of the sleeve of FIG. 5;

FIG. 7 is a top plan view of the sleeve FIG. 5;

FIG. 8A is a partial side elevational view of an alternate embodiment of a sleeve in accordance with the present invention;

FIG. 8B is a partial side elevational view of another alternate embodiment of a sleeve in accordance with the present invention;

FIG. 8C is a partial side elevational view of yet another alternate embodiment of a sleeve in accordance with the present invention;

FIG. 9 is a cross-sectional view of the sleeve of FIG. 6 taken along line 9—9 of FIG. 6;

DETAILED DESCRIPTION

An example of the present invention is embodied in an improved substrate support assembly that includes an outer covering on upwardly extending arms for supporting a substrate such as a semiconductor wafer. The outer covering is preferably a removable sleeve made of silicon carbide (SiC). The SiC sleeves protect the arms from the harmful atmosphere of the processing chambers in which the support assembly can be used. Typically, the upwardly extending arms of a support assembly are made of quartz. Intricate details can be machined into the tops of the quartz arms such as, for example, a shelf portion or an upwardly extending guide portion for holding the substrate in place. In accordance with the present invention, details such as a shelf portion or an upwardly extending portion can be formed in the sleeves or outer coverings on the quartz arms.

Figure 1:
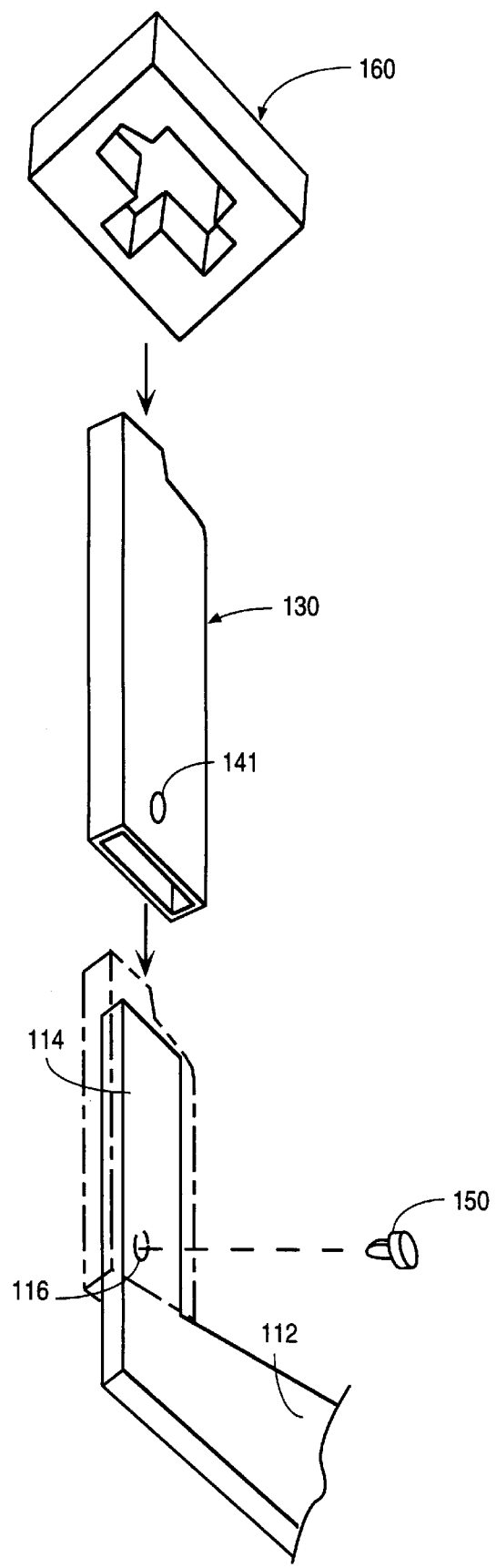
FIG. 1 is an exploded perspective view of a sleeve and arm assembly of a substrate carrier in accordance with the present invention.

FIG. 1 shows an example of the present invention embodied in a sleeve 130 that covers a corresponding substrate support member such as arm 114 which extends upwardly from spoke 112. A plurality of upwardly extending arms is provided in the preferred embodiment of the present invention. A corresponding plurality of sleeves covering the arms is also preferably provided.

To more securely fasten sleeve 130 onto arm 114, a pin 150 is provided and is inserted through hole 141 of sleeve 130 and further into recess 116 define on arm 114. Recess 116 can also be a through-hole. When sleeve 130 is placed onto arm 114, hole 141 is aligned with recess or hole 116. A locking collar 160 is provided to further secure sleeve 130 onto arm 114. Locking collar 160 is slipped over sleeve 130 after sleeve 130 is placed onto arm 114 and pin 150 is inserted through hole 140 and recess 116. Locking collar 160 holds pin 150 in place.

Sleeve 130 is preferably a hollow body made of SiC and has a wall thickness of approximately 0.010 inch (preferably between about 0.003 inch and 0.020 inch). Pin 150 and locking collar 160 are preferably made of quartz, but alternatively can be made of SiC or a material that has a coefficient of thermal expansion similar to SiC or quartz.

Figure 1A:
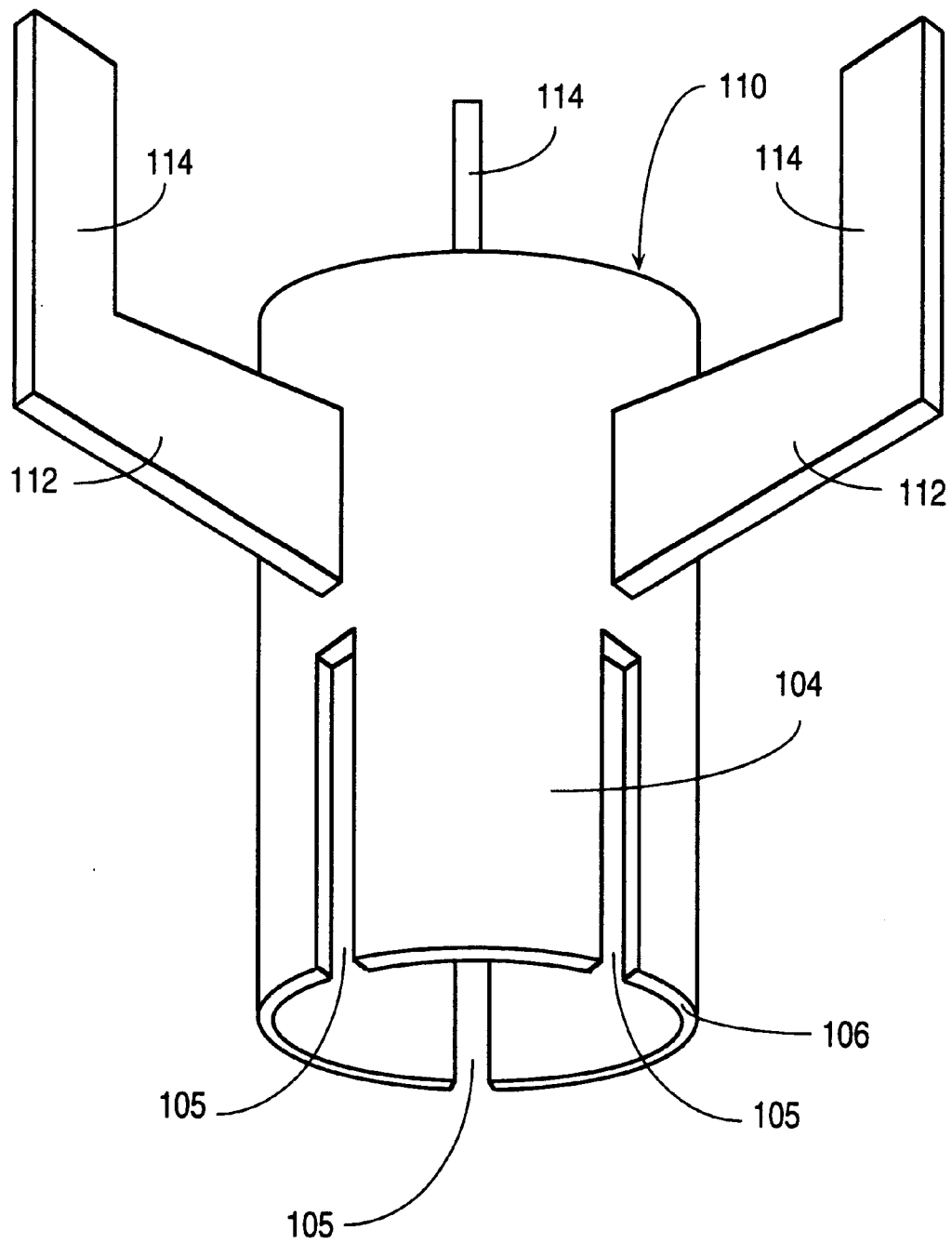
FIG. 1a is a perspective view of the substrate carrier in accordance with the present invention.
Figure 2A:
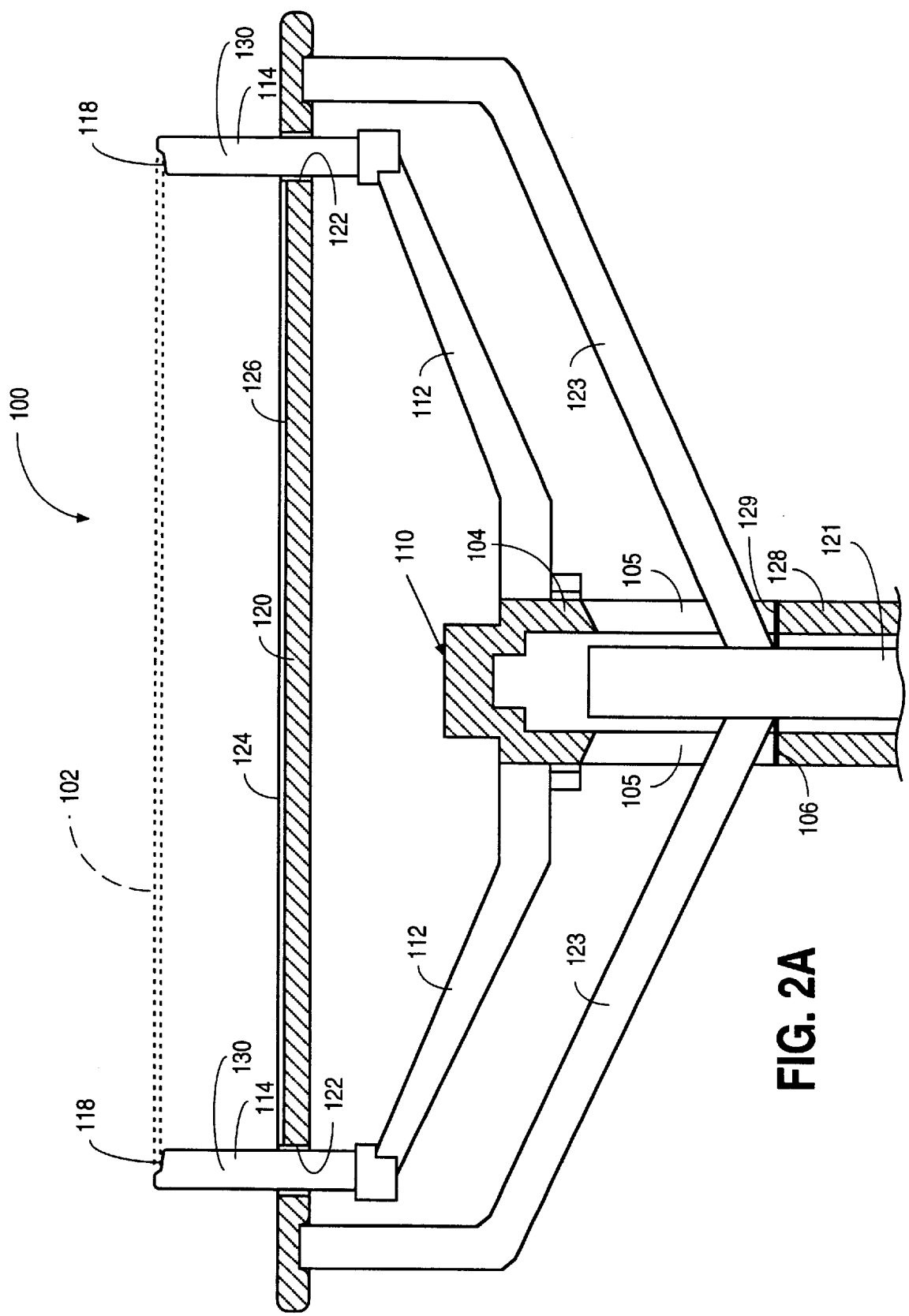
FIG. 2A is a front elevational view of a substrate carrier in a raised position in accordance with the present invention.
Figure 2B:
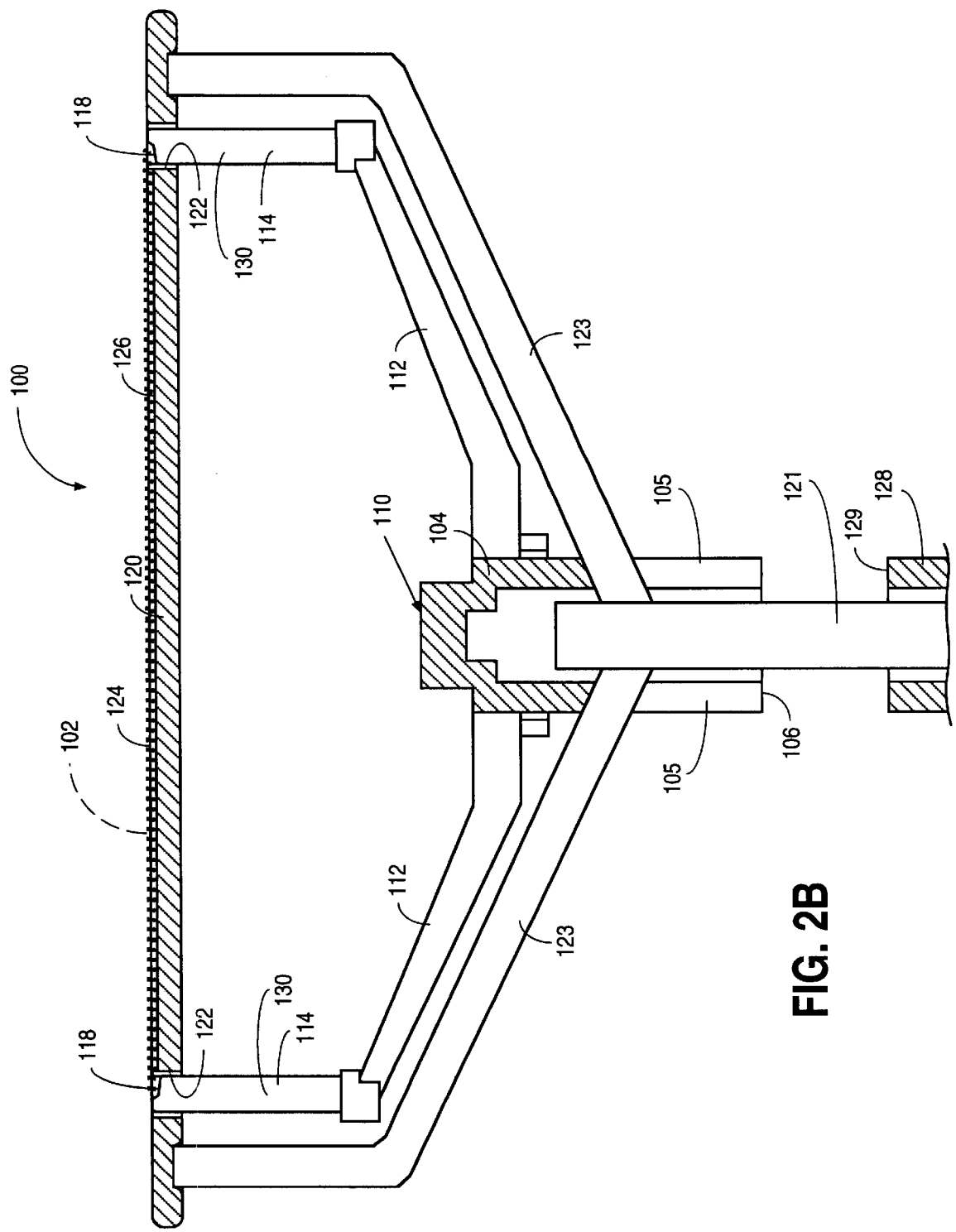
FIG. 2B is a front elevational view of the substrate carrier of FIG. 2A in a lowered position.

FIG. 1a is a simplified illustration of one example of a hub 104 of substrate carrier 110. In the embodiment shown in FIG. 1a, three spokes 112 and their corresponding arms 114 extend from hub 104. Hub 104 is preferably a hollow cylindrical body that has a vertical slot 105 defined below each spoke 112. Slots 105 extend upwardly toward corresponding spokes 112 from bottom edge 106. As shown in FIGS. 2A and 2B and described in further detail below, hub 104 cooperates with platform support spokes 123 and hub lifting tube 128 (see FIGS. 2A and 2B) to raise and lower substrate carrier 110.

FIGS. 2A and 2B show an example of the present invention embodied in a substrate support assembly 100 comprising a substrate carrier 110 cooperating with a platform 120. The substrate carrier 110 includes a plurality of upwardly extending arms 114 covered by sleeves 130. Arms 114 extend upwardly from the ends of corresponding spokes 112. In the example shown in FIGS. 2A and 2B, spokes 112 extend outwardly and slightly upwardly from centrally located hub 104. Hub 104 is below platform 120. Arms 114 are each aligned with and movable through corresponding apertures 122 defined in platform 120. Platform 120 also defines a pocket 124 in which a substrate 102, such as a silicon wafer, for example, rests during processing.

In use, a substrate 102 is placed onto the substrate carrier 110 such that the substrate 102 rests on the tops 118 of arms 114, as shown in FIG. 2A. Substrate carrier 110 is movable vertically with respect to platform 120. Alternatively, platform 120 is movable vertically with respect to substrate carrier 110. In either case, the tops 118 of arms 114 are above the surface of platform 120 during loading and unloading of substrate 102. As shown in FIG. 2A, arms 114 extend above platform 120 such that tops 118 are spaced far enough from platform 120 to allow loading and unloading of substrate 102.

For example, substrate 102 can be carried into position over substrate carrier 110 on a loading blade (not shown) which is typically a flat, paddle-like member that lifts the substrate 102 from the bottom. Substrate carrier 110 is then moved to its raised position such that substrate carrier 110 engages substrate 102 and then lifts substrate 102 off of the blade. Alternatively, the loading blade lowers the substrate onto tops 118 of arms 114 and continues to move downwardly between arms 114, leaving substrate 102 supported by arms 114. The loading blade then moves out from between substrate 102 and platform 120.

After substrate 102 is loaded onto tops 118 of arms 114 (FIG. 2A), substrate carrier 110 can be lowered such that tops 118 of arms 114 are moved to the same level as or slightly below top surface 126 of pocket 124, as shown in FIG. 2B. Substrate 102 then rests within pocket 124 of platform 120. In this position, substrate 102 can be processed. Alternatively, substrate 102 can be processed while resting on the tops of arms 114 of substrate carrier 110 and while spaced apart from platform 120. In this case, substrate 102 need not rest on platform 120. Yet another alternate embodiment of substrate support assembly 100 need not include platform 120.

Raising and lowering of substrate carrier 110 is performed in the embodiments of substrate support assembly 100 shown in FIGS. 2A and 2B by carrier lift tube 128. Carrier lift tube 128 is generally coaxial with platform shaft 121 and is located below platform support spokes 123. Carrier lift tube 128 is movable coaxially with respect to platform shaft 121. As shown in FIG. 2A, carrier lift tube 128 is moved upwardly toward hub 104 such that top edge 129 of carrier tube 128 contacts bottom edge 106 of hub 104. Elongated vertical slots 105 of hub 104 straddle platform support spokes 123 to allow hub 104 to be moved vertically with respect to platform support spokes 123.

FIG. 2B shows substrate carrier 110 in its lowered position. In this position, carrier lift tube 128 has been moved downwardly to its lowered position such that top edge 129 is separated from bottom edge 106 of hub 104. Thus, hub 104 is lowered over platform support spokes 123 and slots 105 straddle or engage platform support spokes 123.

Referring again to FIG. 1, pin 150 and collar 160 serve to anchor sleeve 130 onto arm 114. Anchoring sleeve 130 onto arm 114 is desirable because during lowering of the substrate carrier 110 (FIGS. 2A and 2B), sleeve 130 can come into contact with the edge of aperture 122 and become stuck in aperture 122 while arm 114 continues to be lowered. Sleeve 130 thus could separate from arm 114 and remain stuck in its raised position above platform 120.

The sticking problem can arise in a processing chamber because of thermal expansion and contraction of the materials of the platform and the sleeves or arms. Also, material from the deposition process can accumulate between the parts and cause sticking. Preferably, the apertures 122 in platform 120 and the sleeves 130 are sized such that sticking is minimized. The pin 150 and collar 160 can be provided as an additional measure to minimize the possibility of sticking.

An example of a platform 120 is a susceptor that can be used in an epitaxial atmospheric chamber. Typical susceptors are solid, opaque graphite bodies that are coated with SiC. A typical susceptor is a body that can absorb heat from heat sources outside (above and below) the chamber. The susceptor can provide a generally uniform distribution of heat to the underside of the substrate that rests on the susceptor. Thus, the substrate can have a more uniform thermal distribution throughout its thickness during processing. It is preferable that sleeves 130 be made of SiC so that the susceptor and sleeves have the same resistance to HCl etching for removal of silicon from the deposition process.

Figure 3:
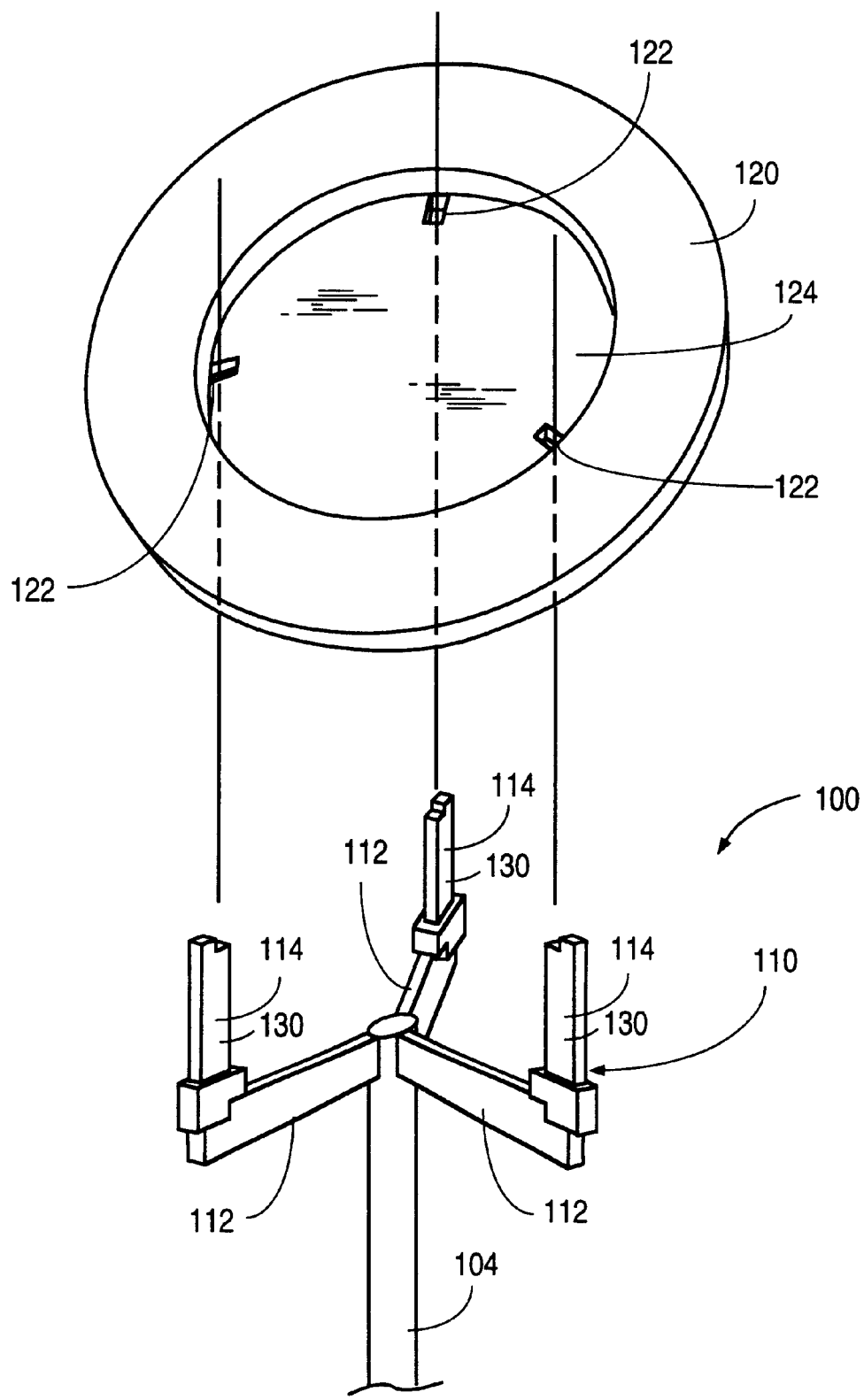
FIG. 3 is a perspective view of the substrate support assembly showing a substrate carrier and a platform in accordance with the present invention.

FIG. 3 illustrates an example of a preferred embodiment of substrate support assembly 100 in which substrate carrier 110 includes three spokes 112, three corresponding upwardly extending arms 114 covered by sleeves 130, and platform 120 including three apertures 122. In the embodiment shown in FIG. 3, apertures 122 are located at the edge of pocket 124 defined on platform 120. This location of apertures 122 provides that the arms 114 will engage the substrate (not shown) at the edge of the substrate. Alternatively, apertures 122 can be located inwardly from the edge of pocket 124 such that arms 114 engage the substrate at positions inward from the edge of the substrate.

The three spokes 112 are preferably attached around hub 104 about 120 degrees apart from each other. Spokes 112, however, need not be radially equidistant from each other around hub 104. FIG. 3 also illustrates how arms 114 are aligned with and movable through corresponding apertures 122 of platform 120. Additional spokes 112 and corresponding apertures 122 can be provided, if desired. For example, substrate carriers having five spokes have been used for processing smaller sized (200 mm) wafers. Additional spokes are advantageous for use with smaller wafers because, typically, smaller wafers are provided in the form of a disc having a chord (known as a "flat"). A five spoke edge lift design can accommodate a wafer having a flat because the wafer will be supported at a minimum of three points on its periphery (or edge), even if the wafer is positioned on the substrate carrier such that one or two of the spokes aligns with the flat of the wafer.

Figures 4, 4A:
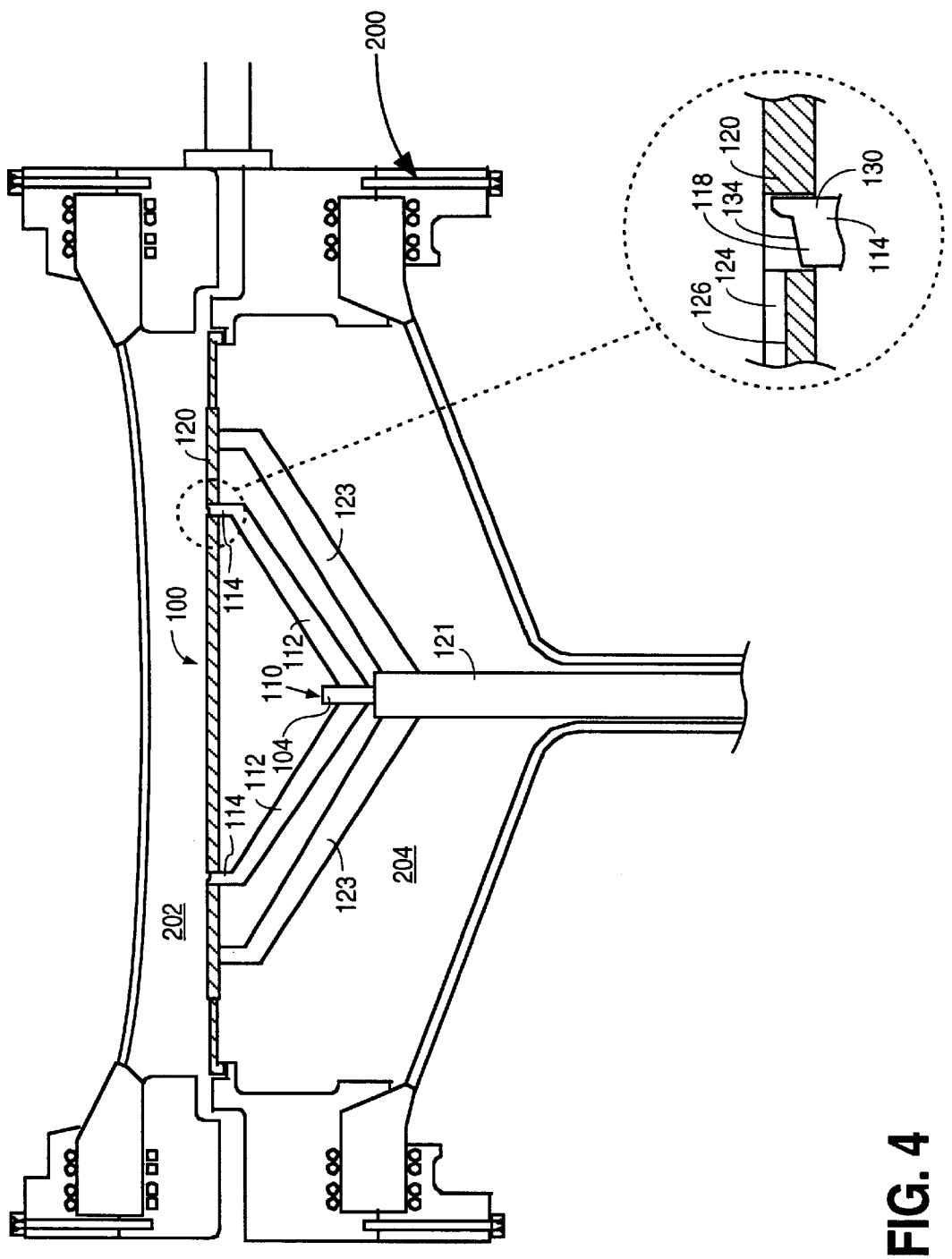
FIG. 4 is a cross-sectional, elevational view of the substrate support assembly positioned for use in a processing chamber in accordance with the present invention.
FIG. 4a is an enlarged, partial, cross-sectional view of an arm and a platform of the substrate support assembly of FIG. 4.

FIG. 4 shows substrate support assembly 100 within an example of a processing chamber 200. Processing chamber 200 surrounds platform 120 and substrate carrier 110. Arms 114 of substrate carrier 110 are shown in the lowered, wafer-processing position with respect to platform 120. As shown in FIG. 4a, arm 114 includes a shelf 134 at its top 118 that is slightly below top surface 126 of pocket 124 defined in platform 120 when arm 114 is in the lowered position. Shelf 134 is preferably formed on a sleeve 130 that covers arm 114. In the position shown in FIG. 4a, the substrate (not shown) rests on the top surface 126 of pocket 124 and need not be supported by arms 114 while in pocket 124. Shelf 134 can alternatively be generally aligned with top surface 126 when arm 114 is in the lowered position.

Referring again to FIG. 4, platform 120 is disposed in chamber 200 such that chamber 200 is divided into an upper region 202 and a lower region 204. Preferably, the portions of arms 114 that are covered by sleeves 130 extend above platform 120 into upper region 202. Sleeves 130 preferably cover most or all of arms 114, as shown in FIGS. 2A and 2B. In the preferred embodiment, sleeves 130 cover most or all of the lengths of arms 114 so that the anchoring mechanism (pin 150 and locking collar 160, shown in FIG. 1) can be located below platform 120 even when substrate carrier 110 is in the raised position (see FIG. 2A). Also, sleeves 130 preferably cover at least the portions of arms 114 that extend into the upper region 202 of chamber 200 so that arms 114 are protected from the potentially harmful conditions that can be present primarily in the upper region 202. It is not necessary, however, for sleeves 130 to cover the entire length of arms 114. For example, the tops 118 can be covered to protect the details machined into the tops 118 without covering the rest of the arm 114. The sleeve 130 or covering need not extend downwardly over a significant portion of the arm 114.

An alternate example of hub 104 is shown in FIG. 4. In this example, hub 104 is in the form of an inner shaft. Hub 104 is preferably coaxial and can be operatively associated with platform shaft 121. In the alternate example of FIG. 4, platform shaft 121 is a hollow shaft that surrounds and is axially movable with respect to hub 104. Platform support spokes 123 extend radially outwardly and upwardly from platform shaft 121 toward platform 120. Platform support spokes 123 hold platform 120. Preferably, platform support spokes 123 are radially aligned with spokes 112 of substrate carrier 110. In the preferred embodiment, substrate support assembly 100 includes three spokes 112 and three platform support spokes 123. Substrate support assembly 100 can also be rotatable about the common axis of hub 104 and platform shaft 121. Hub 104 and platform shaft 121 can rotate together about their common axis to allow a loading blade to be inserted between arms 114 during loading or unloading of a substrate, for example.

FIGS. 5 through 9 show an example of a preferred embodiment of sleeve 130. Referring to FIG. 5, sleeve 130 preferably comprises a hollow body 131 that has a top end 132 and an open bottom end 138. Hole 141 is preferably defined near bottom end 138. Hollow body 131 is preferably elongated vertically as shown in FIG. 5, and includes a first side 133 and an opposing second side 135. First side 133 preferably faces the hub (not shown) when sleeve 130 is placed onto an arm 114 (not shown). Second side 135 preferably faces away from the hub. A shelf 134 is formed at top end 132 and adjacent to first side 133. Upwardly extending portion 136 is also formed at top end 132 and is adjacent second side 135.

In one example of the preferred embodiment, sleeve 130 has a height of about 1.7 inches, a width of about 0.140 inch and a length of about 0.260 inch.

In the example of the sleeve of FIG. 5, shelf 134 is formed at a slight angle from horizontal such as, for example, about 4 degrees from horizontal. Substrate 102 rests on shelf 134 when sleeve 130 engages the edge of substrate 102. The angle of shelf 134 is provided to minimize contact between the bottom side of substrate 102 and sleeve 130 during processing. The angle can accommodate a slight sagging of substrate 102 due to its own weight as it is lifted after the high temperature processing.

Alternatively, top end 132 can be configured to engage substrate 102 at a position entirely underneath substrate 102 (not shown) or inwardly from the edge of substrate 102. In this alternate configuration (not shown), top end 132 would preferably be flat, rather than include shelf 134 and upwardly extending portion 136.

The dimensions of the top end 132 of sleeve 130 are preferably optimized to accommodate variations within the ranges of tolerances for substrates and for the configurations of the arms 114. For example, a substrate carrier 110 having a 3-spoke design for a 12-inch diameter wafer must be able to accommodate the largest and smallest possible diameters of wafers within the smallest and largest, respectively, radii of each arm 114.

In the preferred embodiment as illustrated in FIG. 5 by the exemplary sleeve 130, angle A is preferably about 27.7 degrees, radius R is about 5.945 inches, and the distance H from the top of upwardly extending portion 136 to shelf 134 is about 0.050 inch with an acceptable tolerance of –0.000/+ 0.005 inch. The point where shelf 134 meets upwardly extending portion 136 is preferably sharp to ensure proper placement of the wafer.

FIG. 6 illustrates sleeve 130 having shelf 134 extending across the entire width of sleeve 130. Alternatively, details such as shelf 134 and upwardly extending portion 136 can be configured as desired to effect adequate engagement of the substrate. Also, FIG. 6 shows opening 139 at bottom end 138 of sleeve 130. Opening 139 is configured to accept an arm of the substrate carrier over which sleeve 130 fits.

FIG. 7 shows shelf 134 and upwardly extending portion 136 each extending across the entire width of sleeve 130.

FIG. 8A shows an alternate embodiment of sleeve 130 in which shelf 134A is substantially horizontal. FIG. 8B shows another alternate embodiment of sleeve 130 in which shelf 134B includes a recess 137 adjacent upwardly extending portion 136. In this example, substrate 102 is supported slightly inwardly of its edge by shelf 134B. FIG. 8C shows yet another alternate embodiment of sleeve 130 in which shelf 134C is flat and substrate 102 is supported still further inwardly from its edge.

FIG. 9 shows the hollow body 131 of sleeve 130 in cross-section. First sidewall 143 is at first side 133 of sleeve 130, and second sidewall 145 is at second side 135 of sleeve 130. Hollow body 131 has an inner surface 147, as shown in FIG. 9. Inner surface 147 is preferably smooth and cooperatively engages arm 114 (not shown) when sleeve 130 is placed onto arm 114.

The hollow sleeves can be manufactured by depositing SiC on a machined graphite part and then burning the graphite out. This process results in a hollow SiC sleeve in its finished or near finished geometry.

Figure 12:
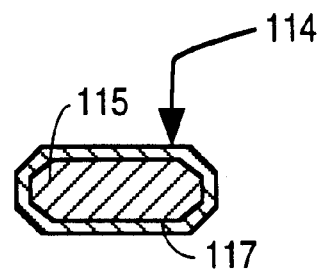
FIG. 12 is a cross-sectional view of the arm of FIG. 10 taken along line 12—12 of FIG. 10.
Figure 11:
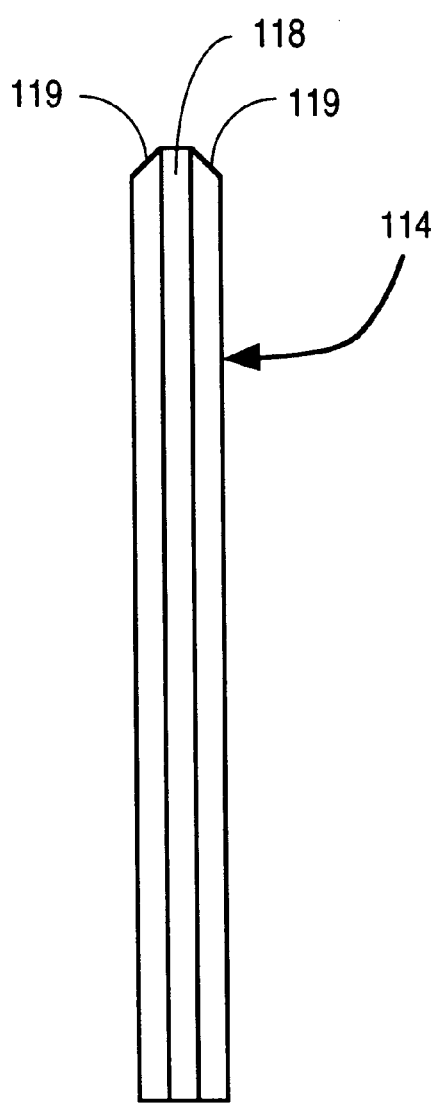
FIG. 11 is a front elevational view of the arm of FIG. 10.
Figure 10:
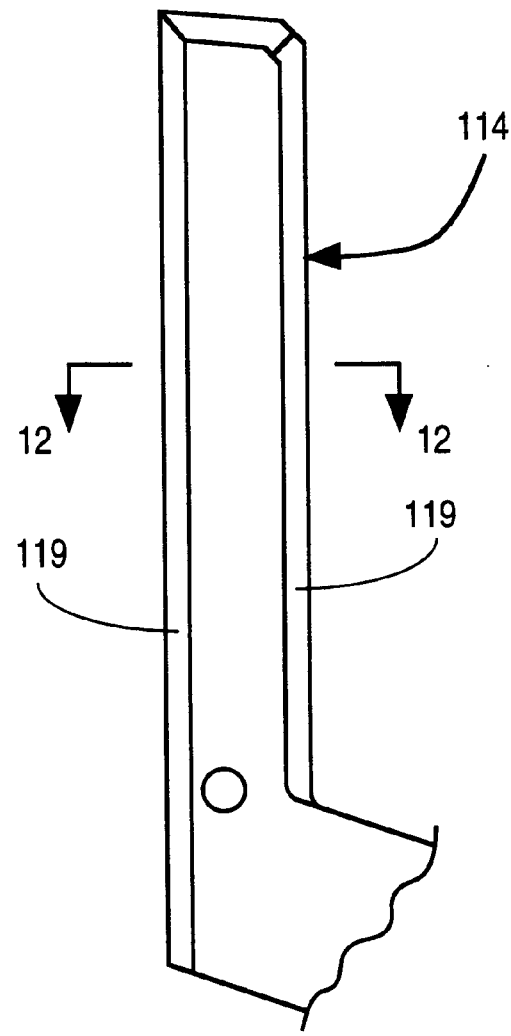
FIG. 10 is a side elevational view of the an upwardly extended arm of the substrate carrier of the present invention.

FIGS. 10 through 12 show an example of an arm 114 of the preferred embodiment. As shown in FIG. 10, arm 114 includes chamfered edges 119. Chamfered edges 119 are provided so that rounded interior corners of hollow sleeve 130 (not shown) can be easily slipped over arm 114. FIG. 11 shows chamfered edges 119 at the top 118 of arm 114. The inside dimensions of the sleeve and the outer dimensions of arm 114 are preferably kept within 0.002 inch to ensure a snug fit.

FIG. 12 illustrates an alternate embodiment of arm 114 in which arm 114 includes an inner portion 115 and an outer portion 117. In the embodiment shown in FIG. 12, arm 114 is preferably made two different materials. For example, inner portion 115 can be made of a material including quartz, and outer portion 117 can be made of a material including SiC. Outer portion 117 can be a coating disposed on inner portion 115, for example. In accordance with the preferred embodiment of the invention, outer portion 117 can also be a sleeve covering inner portion 115.

Figure 13:
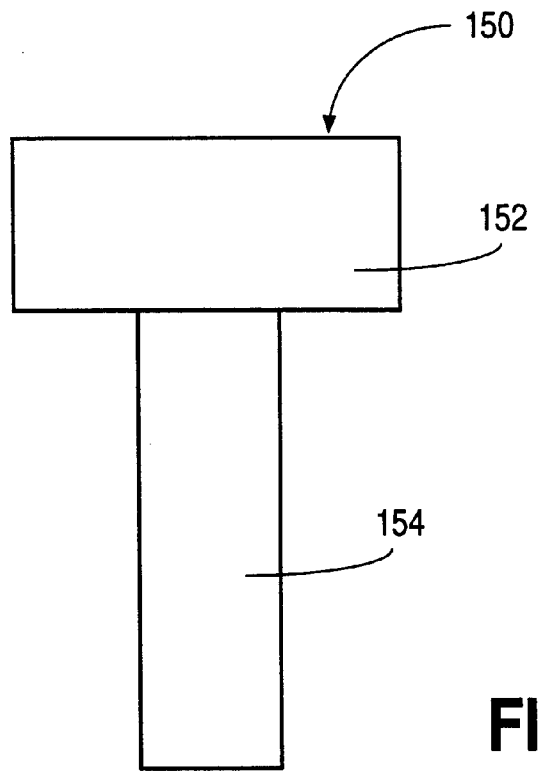
FIG. 13 is a top plan view of a pin in accordance with the present invention.
Figure 14:
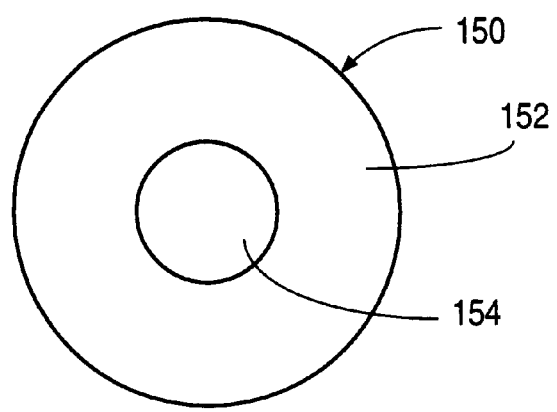
FIG. 14 is a front elevational view of the pin of FIG. 12.

FIGS. 13 and 14 show an example of pin 150. Pin 150 can include head 152 and shaft 154 extending from head 152. Preferably, as shown in FIG. 14, pin 150 is round, but can be any shape such as square, rectangle, or any other suitable shape.

Figure 15:
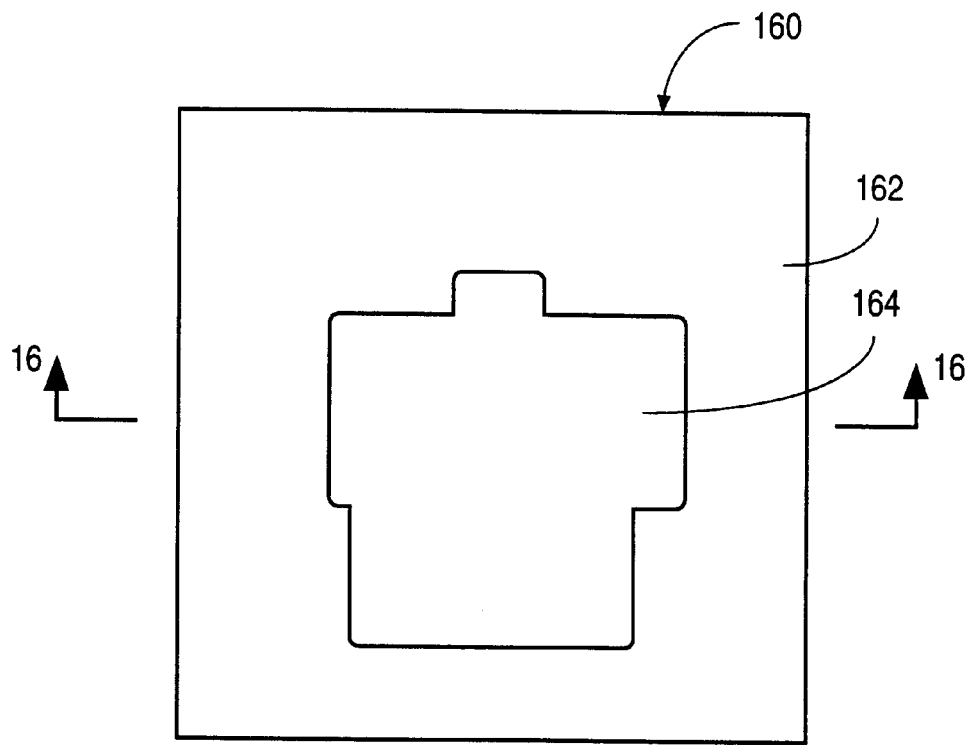
FIG. 15 is a top plan view of a locking collar of the present invention.
Figure 16:
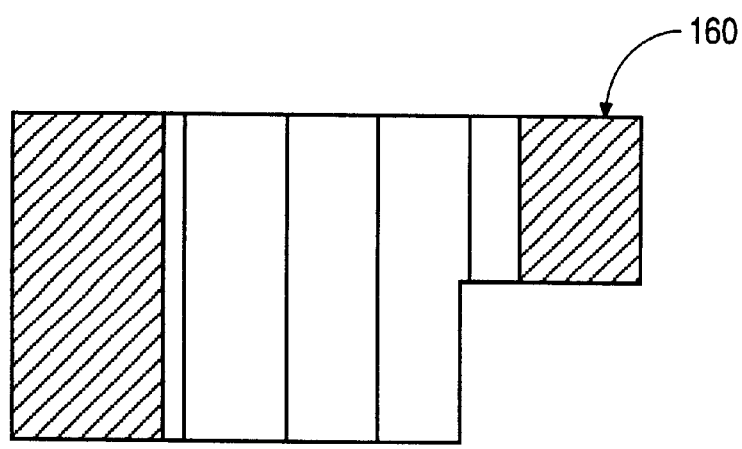
FIG. 16 is a cross-sectional view of the locking collar taken along line 16—16 of FIG. 14.

FIGS. 15 and 16 show an example of a locking collar 160 in accordance with the present invention. Referring to FIG. 15, locking collar 160 comprises a generally square or cube shaped block 162. Block 162 defines a shaped through-hole 164. Through-hole 164 is configured to slide over a sleeve that has been installed onto an arm and that also has been attached to the arm with a pin 150. The periphery of through-hole 164 is shaped so as to provide a relatively snug fit around sleeve 130 and pin 150 (not shown).

A substrate support apparatus and method of making and using the substrate support have been described.

What is claimed is:

1. A substrate support assembly comprising:
    a platform defining a pocket for the substrate and defining a plurality of apertures;
    a substrate carrier having a plurality of upwardly extending arms, each of said arms aligned with and movable through a corresponding one of said apertures; and
    a plurality of sleeves, each of said sleeves covering at least a portion of a corresponding one of said arms.

2. The assembly of claim 1 wherein said platform is movable vertically with respect to said substrate carrier.

3. The assembly of claim 1 wherein said substrate carrier is movable vertically with respect to said platform.

4. The assembly of claim 1 wherein each of said sleeves includes a top end having a shelf and an upwardly extending portion.

5. The assembly of claim 1 further comprising a pin for holding each of said sleeves onto a corresponding one of said arms.

6. The assembly of claim 5 further comprising a locking collar for holding said pin.

7. The assembly of claim 1 wherein said sleeves are silicon carbide.

8. The assembly of claim 1 further comprising a processing chamber surrounding said platform.

9. The assembly of claim 8 wherein said platform is disposed in said chamber such that said chamber is divided into an upper region and a lower region by said platform.

10. The assembly of claim 9 wherein said portions of said arms covered by said sleeves extend above said platform into said upper region of said chamber.

11. The assembly of claim 1 wherein each of said arms is connected to a centrally located hub.

12. The assembly of claim 11 wherein each of said sleeves has a first side facing toward said hub, a second side facing away from said hub, and a top end including a shelf adjacent said first side and an upwardly extending portion adjacent said second side.

13. The assembly of claim 11 wherein said top end of each of said sleeves engages the substrate at an edge of the substrate.

14. A substrate carrier comprising:

a plurality of upwardly extending arms, wherein said arms include an inner portion of a first material and an outer portion of a second material, said first material including quartz, and said second material including silicon carbide.

15. The substrate carrier of claim 14 wherein said outer portion is a coating disposed on said inner portion.

16. The substrate carrier of claim 14 wherein said outer portion is a sleeve covering at least a part of said inner portion.

17. A method of assembling a substrate support assembly comprising:

providing a substrate carrier having a plurality of upwardly extending arms; and covering at least a portion of each of said arms with a sleeve.

18. The method of claim 17 further comprising inserting a pin into a hole defined in said sleeve and further into a recess defined in said arm to hold said sleeve on said arm.

19. The method of claim 18 further comprising installing a locking collar onto said substrate support assembly for holding said pin.

20. A method of supporting a substrate comprising:

providing a substrate support assembly including a plurality of upwardly extending arms, wherein said arms include an inner portion of a first material and an outer portion of a second material, said first material including quartz, and said second material including silicon carbide; and placing the substrate onto said upwardly extending arms.

* * * * *